July 3, 1962 J. B. PEGRAM 3,042,876
DIFFERENTIAL TRANSISTORIZED AMPLIFIER
Filed Jan. 30, 1958
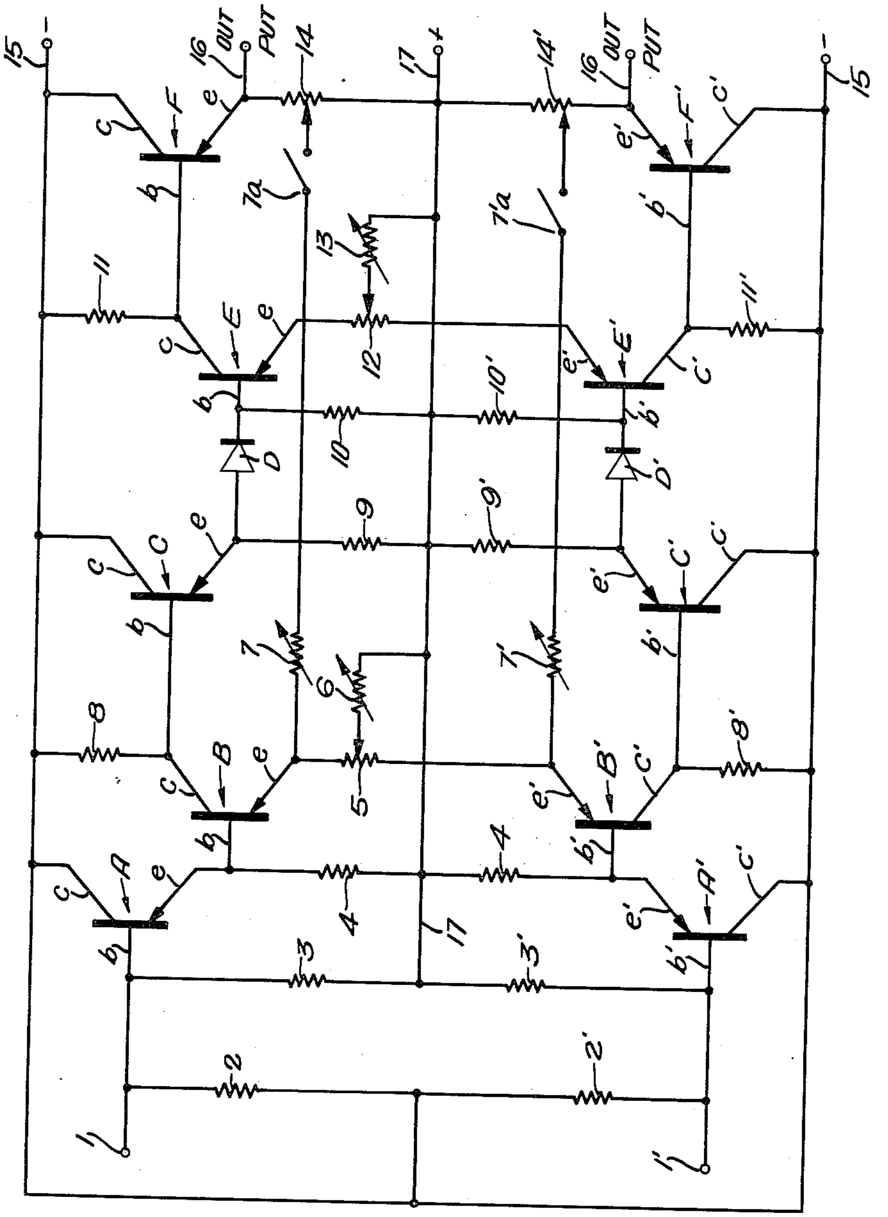
JOHN B. PEGRAM
INVENTOR.
BY
ATTORNEY

United States Patent Office 3,042,876

Patented July 3, 1962

3,042,876

DIFFERENTIAL TRANSISTORIZED AMPLIFIER

John B. Pegram, Los Angeles, Calif., assignor, by mesne assignments, to Statham Instruments, Inc., Los Angeles, Calif., a corporation of California Filed Jan. 30, 1958, Ser. No. 712,102
6 Claims. (Cl. 330—19)

This invention relates to differential transistorized amplifiers of the direct coupled type, i.e., in which the network is resistive without coupling of stages by transformers or similar devices or the use of blocking capacitors.

As is well known, transistors are sensitive to temperature changes, the magnitude of the change depending on the type of the transistor. Such temperature changes are amplified and appear as a signal output unrelated to the input signal. Since the signal resulting from temperature changes affects all of the transistors employed, the signal is referred to as the common mode signal.

I have devised a circuit network for such differential amplifier circuits which substantially cancels out this common mode variation so that substantially only the input signal appears amplified at the output of the amplifier.

The circuit of my invention employs two parallel amplifier legs of substantially like electrical characteristics. The signal is placed across the two legs at the base of the transistors forming the first amplification stage. A common feedback connection is provided. An input signal which imposes opposite voltage changes in the two legs, i.e., a differential mode signal will result in a feedback to each leg, which is self cancelling. But where the change in voltage is in the same direction in both legs, as may result from a common mode signal, the feedback for each leg is additive and degenerative for each leg.

These objects and others will appear from the further description of my invention by reference to the drawings, of which:

The single FIGURE is a schematic wiring diagram of the circuit of my invention.

In the single figure the base of all transistors is marked with the letter "*b*," the emitter electrode with the letter "*e*" and the collector electrode with the letter "*c*." Two parallel substantially like legs are provided, as shown. All parts having primed letters or numbers are electrical elements of like characteristics to the unprimed numbers or letters of the first leg, the bases, emitter and collectors of the transistors of the second leg being marked similarly to that of the first leg. The parallel legs are formed by the series connected, first stage impedance reducing transistor A, connected in a common collector configuration as an emitter-follower transistor B, connected in a common emitter configuration second stage impedance reducing transistor C connected similarly to transistor A, a voltage limiting device, for example, a Zener diode D, second stage amplification transistor E connected similarly to transistor B, and impedance reducing transistor F connected similarly to transistor A. The collector electrodes of each of said transistors is connected to the negative terminal 15 of a D.C. source; the amplification stages B and E are connected to the negative pole 15 through resistors 8 and 11, respectively.

The base of stage A is connected through a load resistor 2 to the negative 15 and through a load resistor 3 to the positive 17 of the D.C. source. In like manner the base "*b*" of the transistor B and emitter element "*e*" of transistor A are connected through the load resistor 4 to the positive 17, and the emitter "*e*" of transistor C and the input of the diode D are connected to 17 through the load resistor 9, and the output of the diode D and the base "*b*" of transistor E are connected through a load resistor 10 to the positive pole 17. The output 16 is connected to the emitter of F.

The parallel leg is constructed in the same manner.

As will be seen, the emitter electrodes of stages B and B′ are connected to the positive through variable resistors 5 and 6. The emitters of stages E and E′ are connected to the positive through the variable resistances 12 and 13. The emitter electrode of the last stage F is connected through a variable load resistance 14 to the positive and through a variable resistance 7 to the emitter electrodes of the stage B. This forms a feedback path, coupling the output of the transistor F, and therefore the output of the second stage of amplification composed of transistors C and E, to the emitter-collector circuit of transistor B and also to that of A of the input stage. A variable resistance is provided in this feedback path. In like manner the emitter electrode of stage F′ is connected through a variable load resistance 14′ to the positive pole and a variable resistance 7′ to the emitter electrode "*e*" of the stage A′. This forms a feedback path, coupling the output of the transistor F′, and therefore the output of the second stage of amplification composed of transistors C′ and E, to the emitter-collector circuit of the transistor B and also to that of A of the input stage. A variable resistance is provided in this feedback path. The emitter electrodes "*e*" of stages B and B′ are connected by a common connection through the resistance 5 and in like manner the emitter electrodes of stages E and E′ are connected in common through the resistance 12.

To adjust the circuit, the switches 7*a* and 7′*a* in the feedback connection are opened. Tap of resistance 5 is adjusted to adjust the potential between 16 and 17 and 16′ and 17 to be equal to each other. The resistances 6 and 13 are then adjusted to raise the equal voltage level between 16 and 17 and between 16′ and 17 as desired. Switches 7*a* and 7′*a* are then closed.

A differential mode signal input across 1 and 1′ will change the potential at *b* of stage A and *b*′ of stage A′ an equal amount but in opposite directions, thus, for example, the negative voltage increasing in negative value at *b* of A while decreasing an equal amount in negative value at *b*′ of A′. Consequently, the feedback voltage at "*e*" of stage B and "*e*" of stage B′ will be equal and self-cancelling.

If a common mode signal is imposed on the system so that the voltage at "*e*" of A and A′ both vary in the same direction, the feedback through resistors 7 and 7′ results in a negative feedback imposed at the emitter electrode of stages B and B′ opposite in sign to the common mode signal imposed on the input at base *b* of the stages B and B′, thus degenerating the common mode signal imposed at the base of A and A′.

By varying the relative magnitude of the resistance 6 to 7 and 7′, the relative proportion of degeneration of the common mode and differential mode signal may be obtained.

While the circuit as illustrated is shown using P-N-P transistors, N-P-N transistors may be employed with appropriate changes in circuitry to provide for the different polarities.

While I have described a particular embodiment of my invention for the purpose of illustration, it should be understood that various modifications and adaptations thereof may be made within the spirit of the invention as set forth in the appended claims.

I claim:

1. A direct current transistor amplifier comprising a pair of amplifying channels each having a plurality of cascaded direct coupled transistors, means commonly energizing a given transistor in one channel and a given transistor in the other to provide opposing interchannel feedback therebetween, and means intercoupling in feedback relation a later transistor in each channel with the given transistor in each channel, said common energizing means and said intercoupling feedback means each including variable resistances, whereby the selective adjustment of said variable resistances controls the adjustment and gain of the amplifier and controls the sensitivity of the amplifier to temperature variation, respectively.

2. A direct coupled differential transistor amplifier composed of two parallel legs, each leg containing a plurality of transistors in cascaded stages, said cascaded stages connection comprised of at least one transistor connected to an impedance reducing stage, followed by a transistor connected as an amplification stage, followed by a transistor connected as an impedance reducing stage, each transistor having a base electrode, an emitter electrode, and a collector electrode, means applying an input signal differentially across the base electrodes of the first transistor stages in both legs, a feedback connection in each leg connecting the emitter electrode of a later impedance reducing stage to the emitter electrode of a prior transistor amplification stage, a first resistance in each said feedback connection, and means including a second resistor for commonly energizing the emitter electrodes of said prior amplification stages in both legs.

3. A transistor amplifier that is insensitive to temperature variation including two channels each having a plurality of transistor amplifier stages and a plurality of transistor isolating and impedance reducing stages, with each isolating stage being intermediate a pair of amplifying stages, means introducing an input signal differentially across both channels, means obtaining a differential output signal from both channels, inter-channel feedback means coupling an amplifying stage in one channel with a different amplifying stage in the other channel, and intra-channel feedback means in each channel coupling a later stage therein with a previous stage, said inter-channel coupling means including a variable resistance network commonly coupling a given amplifying stage in each channel with an energizing source of voltage, and said intra-channel feedback means in each channel including a resistance coupling a later stage with said given stage, means for selectively connecting and disconnecting said intrachannel feedback in each channel, whereby when said intra-channel feedback is disconnected in both channels the amplifier may be differentially balanced by adjusting said variable resistance network, the resistance in the intra-channel feedback being adjustable to vary the control exerted by the intra-channel feedback means.

4. A direct coupled differential transistor amplifier composed of two parallel legs, each leg containing a plurality of transistors in cascaded stages of amplification, comprising an input amplification stage including a transistor connected in common collector configuration as an emitter-follower, the emitter of said emitter-follower coupled to the base of a transistor connected in a common emitter configuration, a succeeding amplification stage including an emitter-follower transistor connected in a common collector configuration, whose emitter is coupled to the base of a transistor connected in a common emitter configuration, the base of said second-named emitter-follower transistor being coupled to the collector of the common emitter transistor of the preceding input amplification stage, a third emitter-follower, the base of which is coupled to the collector of the common collector transistor of said succeeding stage, a feedback path between the emitter of the third emitter-follower transistor in one of said legs, and the emitter of the common emitter transistor of said input amplification stage of the same leg, a variable resistance in said feedback path in series with the emitter of said third emitter-follower transistor and the emitter of said common emitter transistor of said input amplification stage, a second and separate feedback path between the emitter of said third emitter-follower transistor of the other of said legs and the emitter of the common emitter transistor of said input amplification stage of the said other leg, and a variable resistance in said feedback path in series with said third emitter-follower transistor of said other leg and the emitter of said common emitter transistor of the input amplification stage of said other leg.

5. In the amplifier circuit of claim 4, a Zener diode in each leg coupled to the emitter of the common emitter transistor of said succeeding stage in each leg and the base of the common emitter transistor of said stage in each leg, and a variable resistor coupling emitters of said common emitter transistor of each of said stages to one of said power terminals.

6. A direct coupled differential transistor amplifier composed of two parallel legs, each leg comprising an input amplifying stage and a succeeding amplifying stage, an amplifying transistor in each stage of each leg, said amplifying transistors each having a base, an emitter and a collector, an input connection coupled to the base of the amplifying transistor of said input stage of each leg and the emitter-collector circuit of said last-named transistor of the input stage of each leg coupled to the base of the amplifying transistor of said succeeding stage of the same leg, and an output coupled to the emitter-collector circuit of said amplifying transistor of said succeeding stage of each leg, a separate feedback path, one for each leg, said feedback paths in each leg coupling the output of the succeeding stages of each leg to the emitter-collector circuit of the amplifying transistor of the input stage of the same leg, and a separate variable resistance in each of said legs.

References Cited in the file of this patent

UNITED STATES PATENTS

| | | |
|---|---|---|
| 2,747,030 | Nuckolls | May 22, 1956 |
| 2,761,917 | Aronson | Sept. 4, 1956 |
| 2,773,945 | Theriault | Dec. 11, 1956 |
| 2,778,884 | Amatniek | Jan. 22, 1957 |
| 2,780,682 | Klein | Feb. 5, 1957 |
| 2,796,468 | McDonald | June 18, 1957 |
| 2,817,718 | Rockwell | Dec. 24, 1957 |
| 2,831,968 | Stanley et al. | Apr. 22, 1958 |
| 2,854,531 | Reijnders | Sept. 30, 1958 |
| 2,887,542 | Blair | May 19, 1959 |
| 2,959,741 | Murray | Nov. 8, 1960 |

OTHER REFERENCES

Braun: "High-Gain Transistor Audio Amplifier," Radio-Electronics, June 1956, pages 30, 31.